United States Patent [19]

Enoki et al.

[11] Patent Number: 5,659,893
[45] Date of Patent: Aug. 19, 1997

[54] TRANSMISSION CIRCUIT WITH IMPROVED GAIN CONTROL LOOP

[75] Inventors: Takashi Enoki; Masaharu Nakatsuchi; Kohji Chiba; Fujio Sasaki, all of Yokohama, Japan

[73] Assignees: Matsushita Communication Industrial Co., Ltd., Yokohama; NTT Mobile Communications Network, Inc., Tokyo, both of Japan

[21] Appl. No.: 341,186

[22] Filed: Nov. 18, 1994

[30] Foreign Application Priority Data

Nov. 19, 1993 [JP] Japan ................................. 5-290166
Nov. 19, 1993 [JP] Japan ................................. 5-290167

[51] Int. Cl.$^6$ ........................................... H04B 1/04
[52] U.S. Cl. ........................ 455/126; 455/116; 455/127; 455/571; 330/129; 330/279
[58] Field of Search ........................ 455/126, 127, 455/115, 116, 89, 88; 330/129, 149, 136, 279

[56] References Cited

U.S. PATENT DOCUMENTS

| | | | |
|---|---|---|---|
| 3,486,128 | 12/1969 | Lohrmann | 455/126 |
| 3,900,823 | 8/1975 | Sokal et al. | 330/129 |
| 4,631,491 | 12/1986 | Smithers | 330/129 |
| 4,709,403 | 11/1987 | Kikuchi | 455/126 |
| 4,873,493 | 10/1989 | Fujiwara | 330/136 |
| 4,996,501 | 2/1991 | Sano et al. | 330/279 |
| 5,063,287 | 11/1991 | Trace et al. | 330/279 |
| 5,144,258 | 9/1992 | Nakanishi et al. | 455/126 |
| 5,146,614 | 9/1992 | Furuno | 455/127 |

FOREIGN PATENT DOCUMENTS

| | | |
|---|---|---|
| 159 670 | 10/1985 | European Pat. Off. . |
| 524 008 | 1/1993 | European Pat. Off. . |
| 2 690 021 | 10/1993 | France . |
| 55-035514 | 5/1980 | Japan . |
| 56-066916 | 8/1981 | Japan . |
| 1-220919A | 9/1989 | Japan . |
| 3-76430A | 4/1991 | Japan . |

*Primary Examiner*—Reinhard J. Eisenzopf
*Assistant Examiner*—Doris To
*Attorney, Agent, or Firm*—Spencer & Frank

[57] ABSTRACT

In a transmission circuit, part of the output signal of the transmission circuit is diverted by an output monitor circuit and subjected to envelope detection by an output detector circuit. The output signal of the output detector circuit is inputted to a peak hold circuit successively holding the peaks of the input signal, so that varying amplitude components are removed, and a DC value is detected. An error detector circuit compares the detected value with a reference signal from a reference signal generator circuit, and the error signal is used as a gain control signal to control the gain of a power amplifier circuit.

11 Claims, 17 Drawing Sheets

21 HIGH-FREQUENCY SIGNAL

22 DETECTOR OUTPUT SIGNAL

23 PEAK HOLD SIGNAL

24 REFERENCE SIGNAL

25 GAIN CONTROL SIGNAL

61 HIGH-FREQUENCY SIGNAL

62 DETECTOR OUTPUT SIGNAL

63 PEAK HOLD SIGNAL

64 REFERENCE SIGNAL

65 GAIN CONTROL SIGNAL

66 POWER SUPPLY CONTROL SIGNAL

81 HIGH-FREQUENCY SIGNAL

82 INPUT-DETECTOR OUTPUT SIGNAL

83 POWER SUPPLY CONTROL SIGNAL

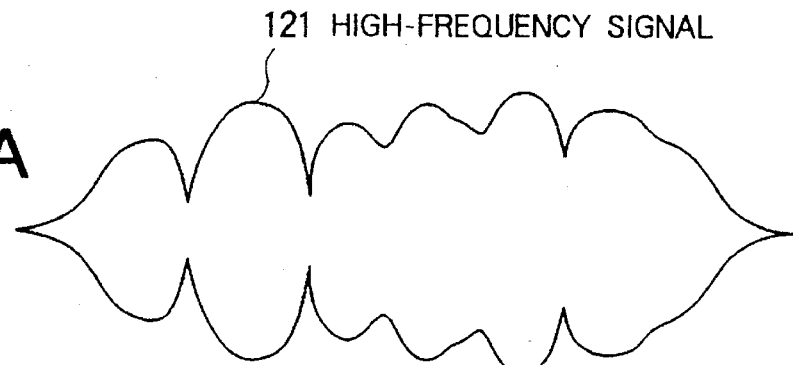
FIG. 12A  121 HIGH-FREQUENCY SIGNAL
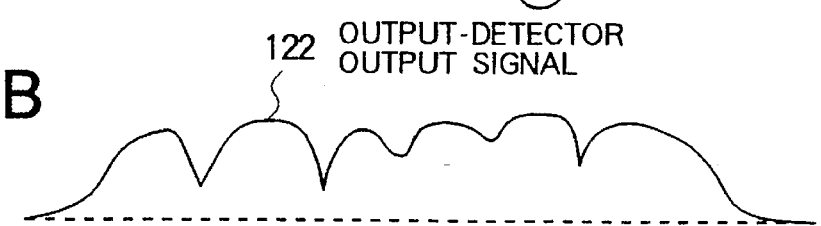
FIG. 12B  122 OUTPUT-DETECTOR OUTPUT SIGNAL
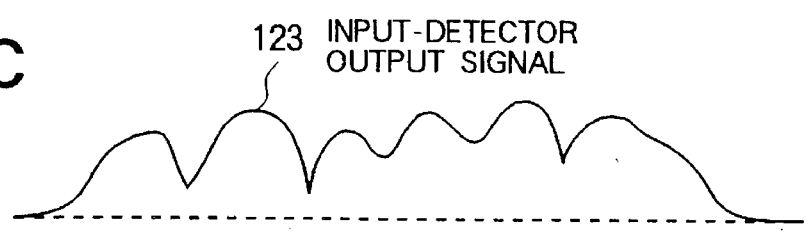
FIG. 12C  123 INPUT-DETECTOR OUTPUT SIGNAL
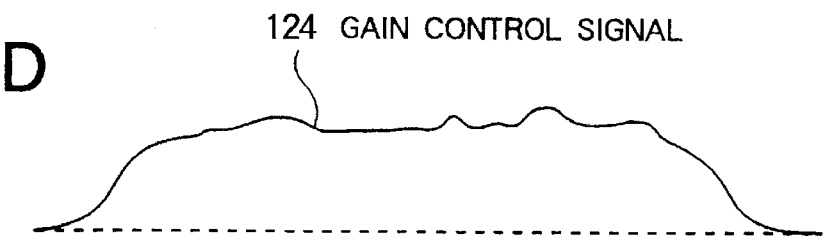
FIG. 12D  124 GAIN CONTROL SIGNAL

151 HIGH-FREQUENCY SIGNAL

152 OUTPUT-DETECTOR OUTPUT SIGNAL

153 INPUT-DETECTOR OUTPUT SIGNAL

154 GAIN CONTROL SIGNAL

155 POWER SUPPLY CONTROL SIGNAL

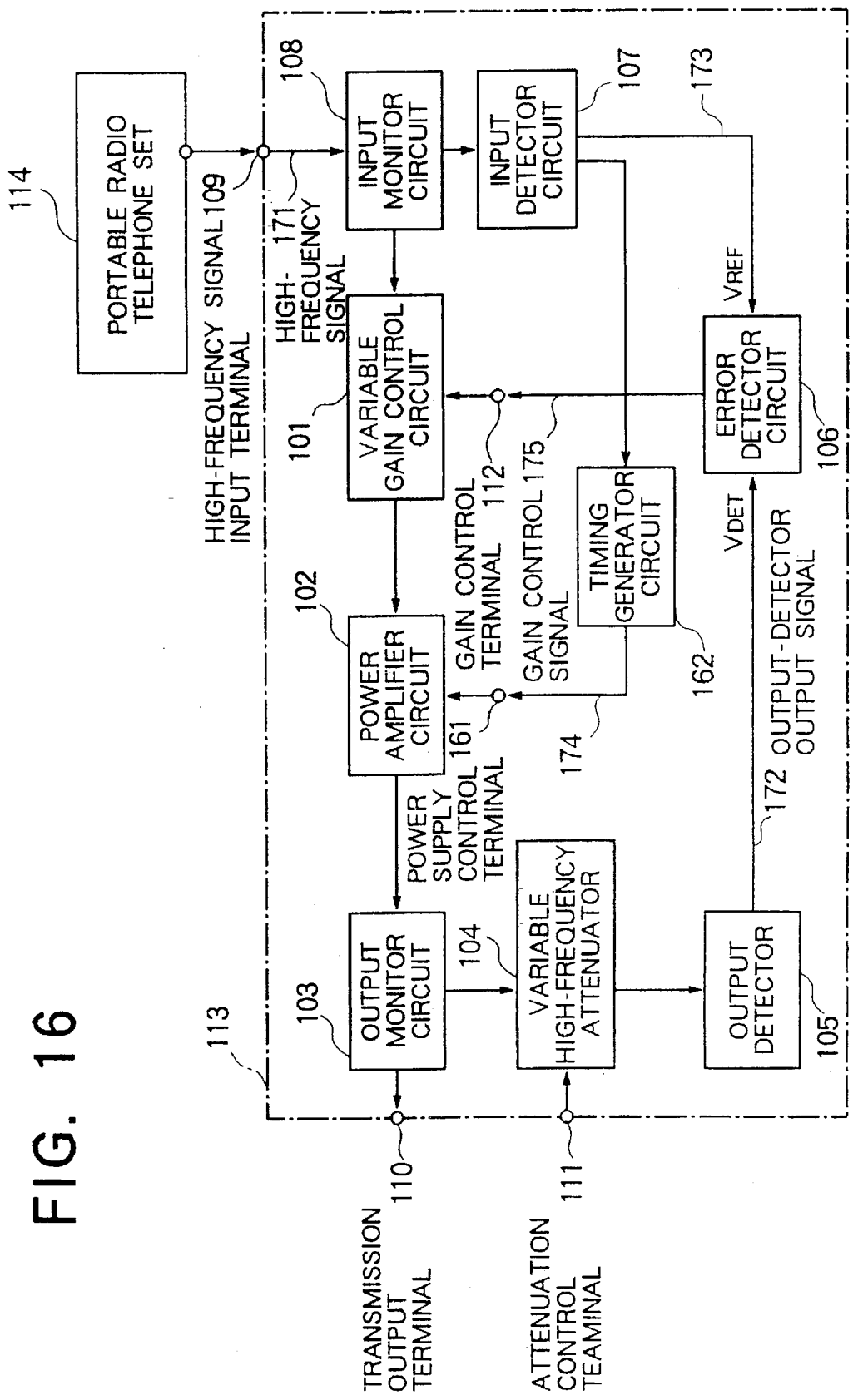

171 HIGH-FREQUENCY SIGNAL

172 OUTPUT-DETECTOR OUTPUT SIGNAL

177 INPUT-DETECTOR OUTPUT SIGNAL

174 POWER SUPPLY CONTROL SIGNAL

175 GAIN CONTROL SIGNAL

TRANSMISSION CIRCUIT WITH IMPROVED GAIN CONTROL LOOP

BACKGROUND OF THE INVENTION

1. Field of the Invention

This invention relates to a transmission circuit for use in a radio transmitter, such as a transmission circuit used in the field of mobile radio communication.

2. Description of the Related Art

FIG. 1 is a block diagram showing the structure of a prior art transmission circuit. Referring to FIG. 1, the prior art transmission circuit includes a power amplifier circuit 1, an output monitor circuit 2, an output detector circuit 3, an error detector circuit 4, a reference signal generator circuit 5, a high-frequency signal input terminal 6, a gain control terminal 7 and a transmission output terminal 8.

The operation of the prior art transmission circuit having the above structure will now be described. A high-frequency signal inputted through the high-frequency signal input terminal 6 is amplified by the power amplifier circuit 1, and, after being then branched or split by the output monitor circuit 2, part of the amplified high-frequency signal is outputted from the transmission output terminal 8. The remaining part of the amplified high-frequency signal is inputted to the output detector circuit 3, and the output signal $V_{DET}$ of the output detector circuit 3 is inputted to the error detector circuit 4. In the error detector circuit 4, the detected voltage signal $V_{DET}$ is compared with a reference signal $V_{REF}$ from the reference signal generator circuit 5 to detect the error voltage, and the detected error voltage signal is then inputted to the power amplifier circuit 1 through the gain control terminal 7 so as to control the gain of the power amplifier circuit 1.

However, in the case where the high-frequency signal inputted through the high-frequency input terminal 6 of the transmission circuit having the structure as described above is a linear modulated signal whose amplitude carries some kind of information, this manner of loop control will cancel the modulation when the reference signal $V_{REF}$ is a constant voltage. Thus, the prior art transmission circuit has had the problem that its output waveform tends to be distorted.

SUMMARY OF THE INVENTION

With a view to solve such a prior art problem, it is an object of the present invention to provide a transmission circuit which can transmit a high-frequency signal with satisfactory transmission performance and without giving rise to undesirable distortion of its output waveform attributable to the loop control even when the reference signal inputted to its error detector circuit is a constant voltage.

The transmission circuit according to the present invention which attains the above object comprises an output detector circuit subjecting part of the output signal of the transmission circuit to envelope detection, a peak hold circuit successively holding the peaks of the output signal of the output detector circuit, and an error detector circuit comparing the output signal of the peak hold circuit with a reference signal to generate the error signal used for controlling the gain of a power amplifier circuit.

Thus, in the transmission circuit according to the present invention, part of the output signal of the transmission circuit is subjected to envelope detection by the output detector circuit, and the output signal of the output detector circuit is inputted to the peak hold circuit successively holding the peaks of the output signal of the output detector circuit, so that the peak level of the output signal of the transmission circuit is detected as a DC value. Therefore, even when the reference signal is a constant voltage, the modulation would not be cancelled by the loop control, and the transmission circuit can operate to exhibit the desired satisfactory transmission performance.

BRIEF DESCRIPTION OF THE DRAWINGS

FIGS. 12A to 12D show waveforms of various signals appearing in the seventh embodiment of the transmission circuit according to the present invention.

FIG. 16 is a block diagram showing the structure of a tenth embodiment of the transmission circuit according to the present invention.

DESCRIPTION OF THE PREFERRED EMBODIMENTS

Figure 1:
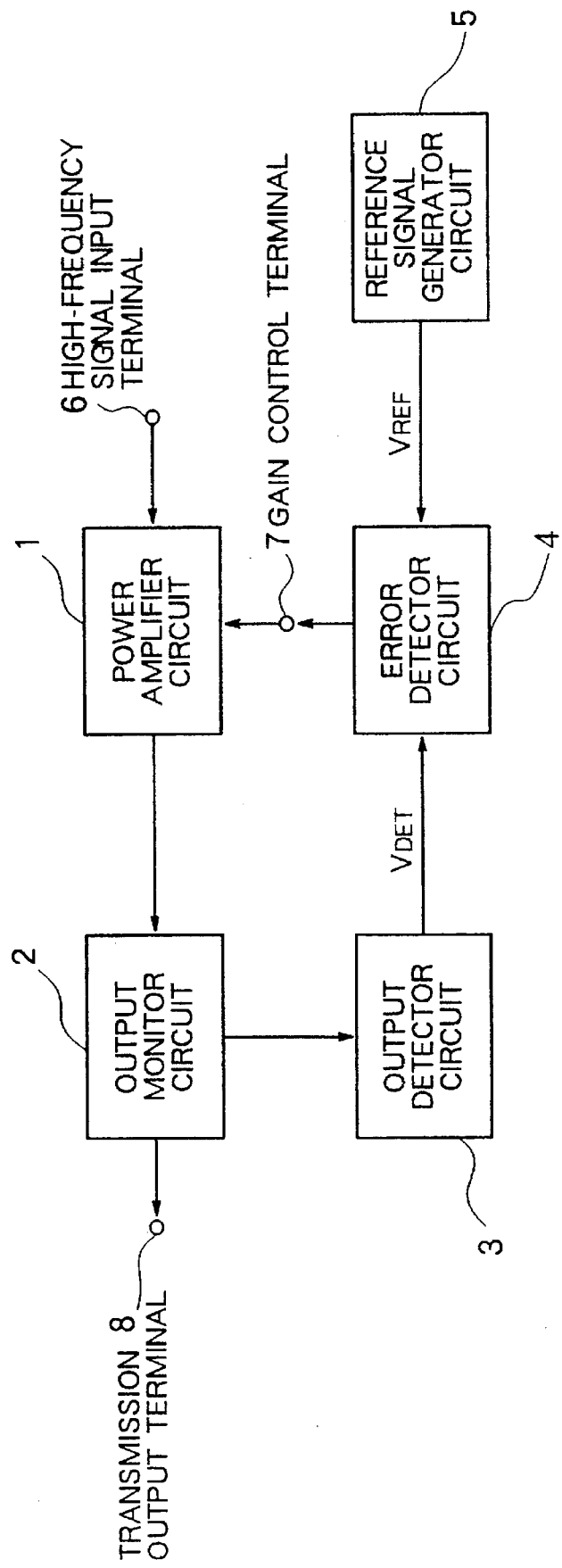
FIG. 1 is a block diagram showing the structure of a prior art transmission circuit.
Figure 2:
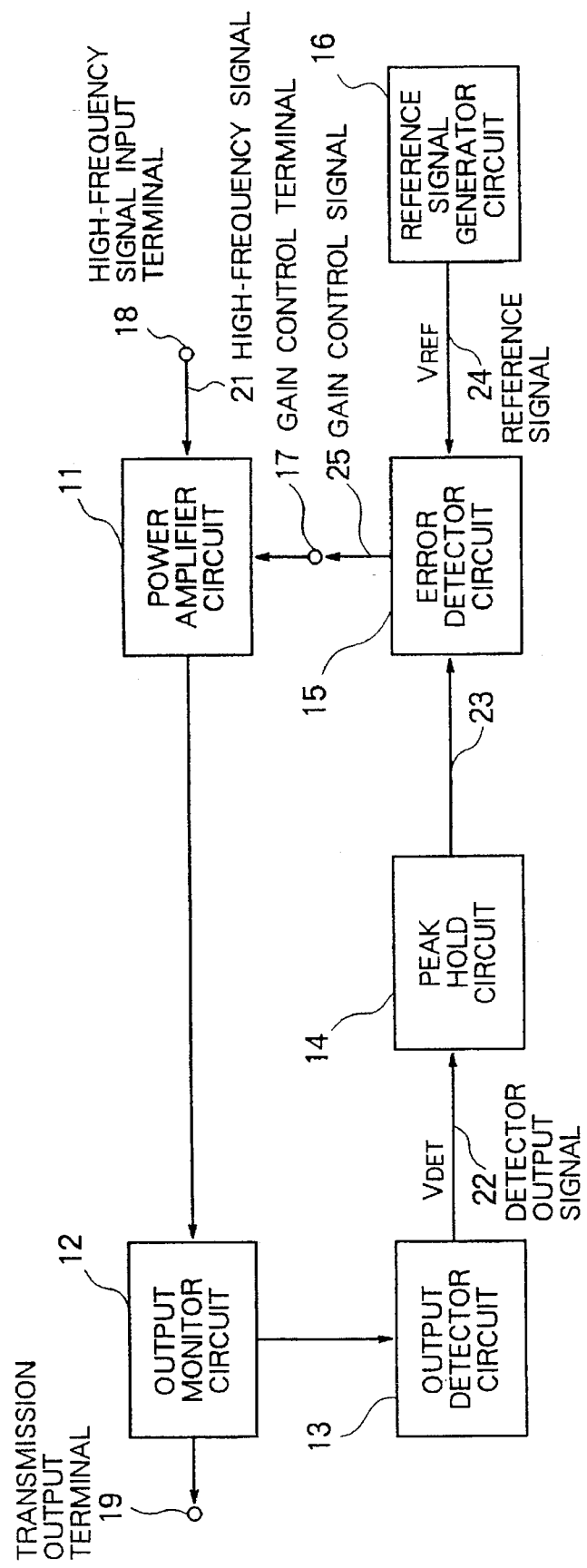
FIG. 2 is a block diagram showing the structure of a first embodiment of the transmission circuit according to the present invention.

A first embodiment of the present invention will now be described by reference to the drawings. FIG. 2 is a block diagram showing the structure of the first embodiment of the transmission circuit according to the present invention, and FIGS. 3A to 3E show waveforms of various signals appearing in the transmission circuit shown in FIG. 2.

Referring to FIG. 2, the transmission circuit comprises a power amplifier circuit 11 amplifying a high-frequency signal 21, an output monitor circuit 12 diverting part of the output signal of the transmission circuit, an output detector circuit 13 subjecting a monitor signal, which is the output signal of the output monitor circuit 12, to envelope detection, a peak hold circuit 14 successively holding the peaks of a detector output signal 22, an error detector circuit 15 comparing the output signal of the peak hold circuit 14 with a reference signal $V_{REF}$ generated by a reference signal generator circuit 16 thereby generating the error voltage, a gain control terminal 17 of the power amplifier circuit 11, a high-frequency signal input terminal 18, and a transmission output terminal 19.

Figure 3A:
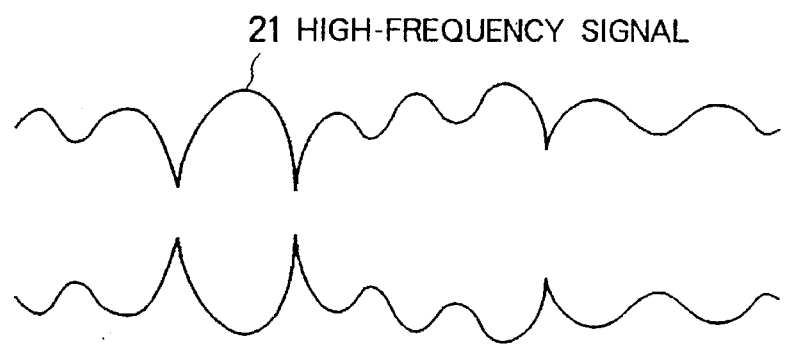
FIGS. 3A to 3E show waveforms of various signals appearing in the first embodiment of the transmission circuit according to the present invention.

The operation of the first embodiment of the transmission circuit of the present invention having the above structure will now be described by reference to FIG. 2 together with FIGS. 3A to 3E. A high-frequency signal 21 having a waveform as shown in FIG. 3A is inputted through the high-frequency signal input terminal 18 to the power amplifier circuit 11 and, after being amplified by the power amplifier circuit 11 and then passed through the output monitor circuit 12, appears at the transmission output terminal 19 as the output signal of the transmission circuit.

Figure 3B:
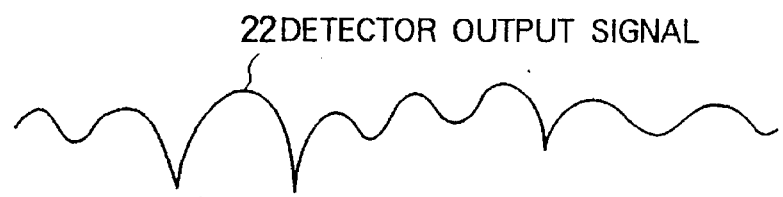
Figure 3C:
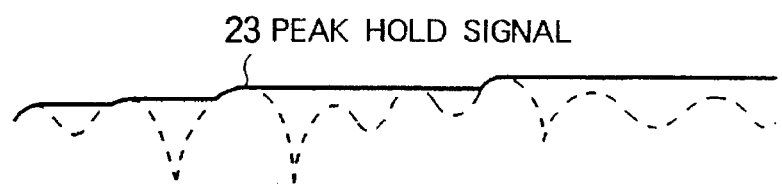
Figure 3D:
Figure 3E:
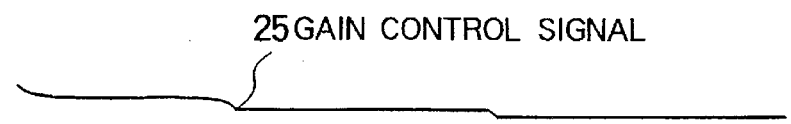

On the other hand, part of the output signal of the transmission circuit is branched or split off by the output monitor circuit 12 to be inputted as the monitor signal to the output detector circuit 13 and, after being detected by the output detector circuit 13, appears as the detector output signal 22 having a waveform as shown in FIG. 3B. The detector output signal 22 is inputted to the peak hold circuit 14 generating a peak hold signal 23 successively holding the peaks of the detector output signal 22 and having a waveform as shown in FIG. 3C. The peak hold circuit 14 is composed of the combination of, for example, time constant circuits, and its time constant during charging is selected to be small so as to follow the detector output signal 22, while its time constant during discharging is selected to be large so as to hold the peak value. The reference signal generator circuit 16 generates the reference signal 24 having a waveform as shown in FIG. 3D so as to set the reference level of the output signal of the transmission circuit. The error detector circuit 15 detects an error voltage by comparing the peak hold signal 23 with the reference signal 24 and, after amplifying the error voltage, outputs the error voltage signal. This error voltage signal is inputted as a gain control signal 25 having a waveform as shown in FIG. 3E to the power amplifier circuit 11 through the gain control terminal 17 so as to control the gain of the power amplifier circuit 11.

It will be seen from the above description of the first embodiment of the present invention that, even though the high-frequency input signal may be a modulated wave signal having a varying amplitude, the gain control signal 25 for controlling the gain of the power amplifier circuit 11 is substantially maintained at a constant level, and undesirable distortion of the output waveform attributable to the loop control would not occur, so that the desired satisfactory transmission performance can be exhibited.

Figure 4:
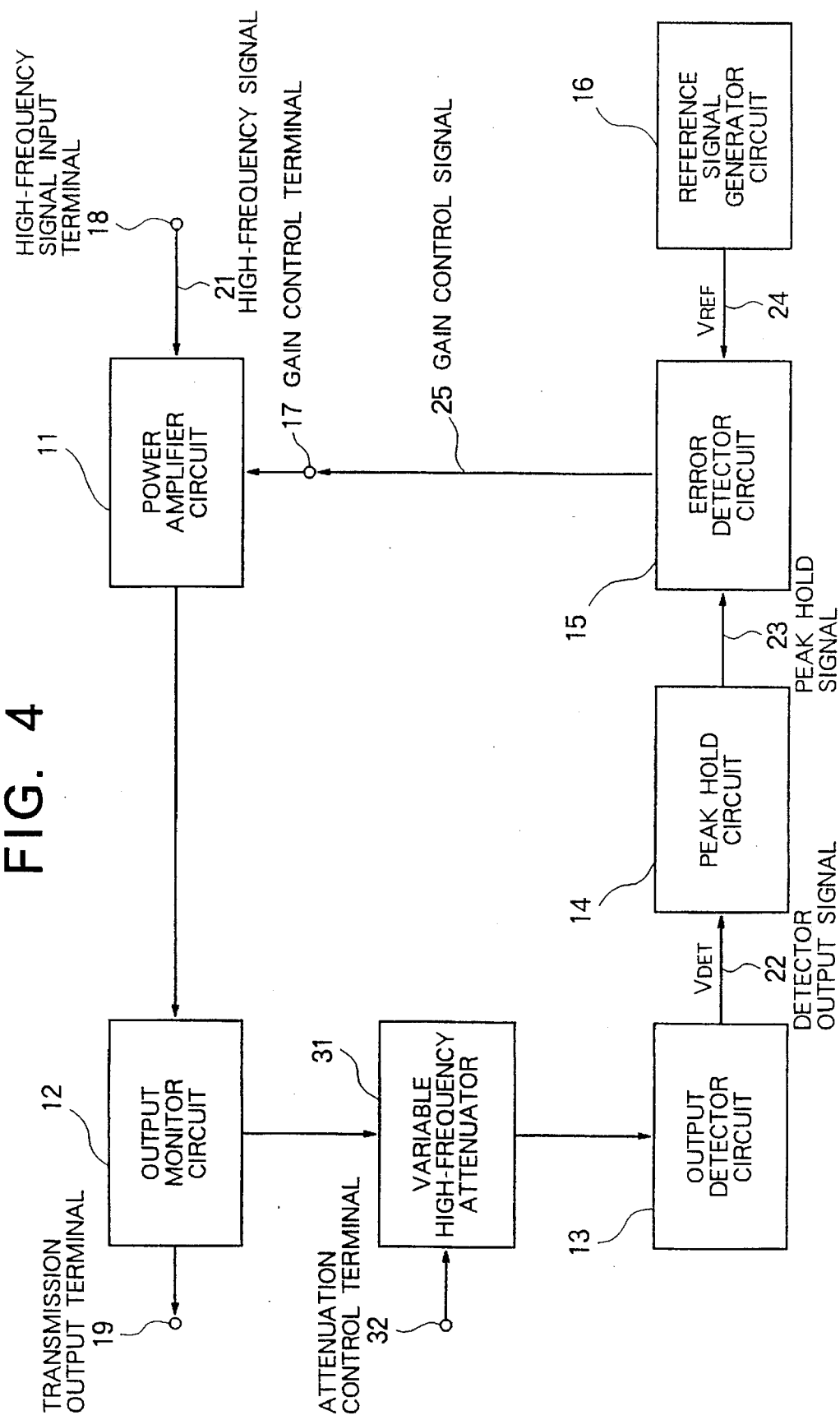
FIG. 4 is a block diagram showing the structure of a second embodiment of the transmission circuit according to the present invention.

FIG. 4 is a block diagram showing the structure of a second embodiment of the transmission circuit according to the present invention. This second embodiment is a partial modification of the first embodiment shown in FIG. 2, and the same reference numerals are used to designate the same or equivalent parts appearing in FIG. 2 so as to dispense with repetition of the same description. This second embodiment differs from the first embodiment in that a variable high-frequency attenuator 31 having an attenuation control terminal 32 is connected between the output monitor circuit 12 and the output detector circuit 13.

The operation of the second embodiment of the transmission circuit of the present invention having the above structure will now be described by reference to FIG. 4 together with FIGS. 3A to 3E. A high-frequency signal 21 is inputted through the high-frequency signal input terminal 18 to the power amplifier circuit 11 and, after being amplified by the power amplifier circuit 11 and then passed through the output monitor circuit 12, appears at the transmission output terminal 19 as the output signal of the transmission circuit.

On the other hand, part of the output signal of the transmission circuit is branched by the output monitor circuit 12 to be inputted as the monitor signal to the variable high-frequency attenuator 31 and, after being attenuated by a predetermined amount by the attenuation control signal inputted through the attenuation control terminal 32, inputted to the output detector circuit 13 to be detected. The detector output signal 22, which is the output signal of the output detector circuit 13, is inputted to the peak hold circuit 14 generating the peak hold signal 23 successively holding the peaks of the detector output signal 22. The peak hold circuit 14 is composed of the combination of, for example, time constant circuits, and its time constant during charging is selected to be small so as to follow the detector output signal 22, while its time constant during discharging is selected to be large so as to hold the peak value. The reference signal generator circuit 16 generates the reference signal 24 so as to set the reference level of the output signal of the transmission circuit. The error detector circuit 15 detects the error voltage by comparing the peak hold signal 23 with the reference signal 24 and, after amplifying the detected error voltage, outputs the error voltage signal. This error voltage signal is inputted as the gain control signal 25 to the power amplifier circuit 11 through the gain control terminal 17 so as to control the gain of the power amplifier circuit 11.

It will be seen from the above description of the second embodiment of the present invention that the variable high-frequency attenuator 31 is connected between the output monitor circuit 12 and the output detector circuit 13. Therefore, when, for example, the amount of attenuation by the variable high-frequency attenuator 31 is selected to increase in a relation corresponding to an increase in the value of the output signal of the transmission circuit, the power inputted to the output detector circuit 13 can be maintained at the same level regardless of a change in the value of the output signal of the transmission circuit, so that the range $\Delta P$ of the output signal of the transmission circuit that can be detected within a detected voltage range $\Delta V$ can be widened. That is, regardless of a change in the value of the output signal of the transmission circuit, the proper detected voltage can be always obtained, so that the desired satisfactory loop control can be attained.

Figure 5:
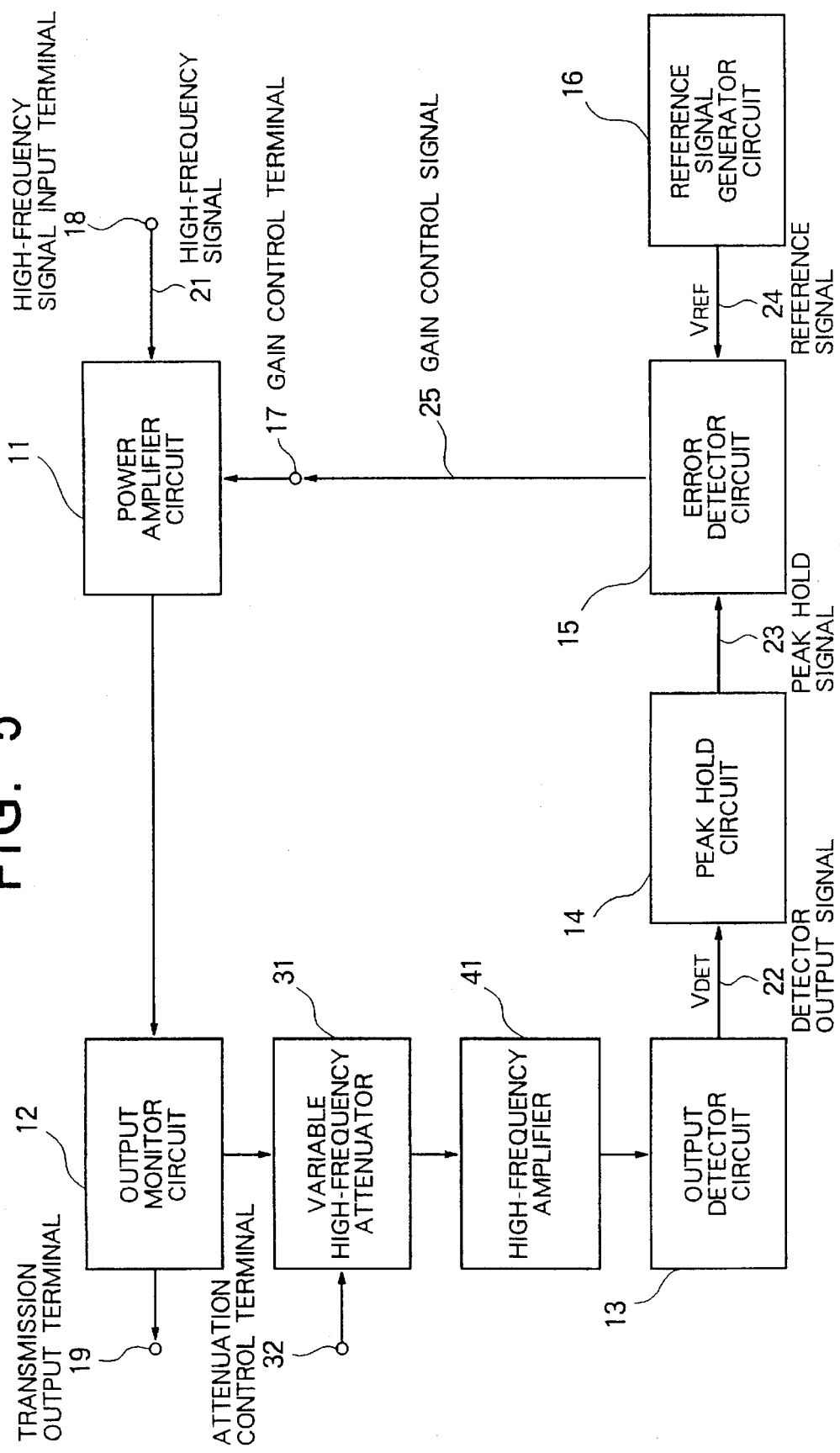
FIG. 5 is a block diagram showing the structure of a third embodiment of the transmission circuit according to the present invention.

FIG. 5 is a block diagram showing the structure of a third embodiment of the transmission circuit according to the present invention. The third embodiment shown in FIG. 5 is a partial modification of the second embodiment shown in FIG. 4, and the same reference numerals are used to designate the same or equivalent parts so as to dispense with repetition of the same description. Waveforms of various signals are the same as those shown in FIGS. 3A to 3E. This third embodiment differs from the second embodiment in that a high-frequency amplifier 41 is connected between the variable high-frequency attenuator 31 and the output detector circuit 13.

The operation of the third embodiment of the transmission circuit of the present invention having the above structure will now be described by reference to FIG. 5 together with FIGS. 3A to 3E. A high-frequency signal 21 is inputted through the high-frequency input terminal 18 and, after being amplified by the power amplifier circuit 11 and then passed through the output monitor circuit 12, appears at the transmission output terminal 19 as the output signal of the transmission circuit.

On the other hand, part of the output signal of the transmission circuit is branched by the output monitor circuit 12 to be inputted as the monitor signal to the variable high-frequency attenuator 31 and, after being attenuated by a predetermined amount by the control signal inputted through the attenuation control terminal 32 and amplified by the high-frequency amplifier 41, inputted to the output detector circuit 13 to be detected. The detector output signal, which is the output signal 22 of the output detector circuit 13, is inputted to the peak hold circuit 14 generating the peak hold signal 23 successively holding the peaks of the detector output signal 22. The peak hold circuit 14 is composed of the combination of, for example, time constant circuits, and its time constant during charging is selected to be small so as to follow the detector output signal 22, while its time constant during discharging is selected to be large so as to hold the peak value. The reference signal generator circuit 16 generates the reference signal 24 so as to set the reference level of the output signal of the transmission circuit. The error detector circuit 15 detects the error voltage by comparing the peak hold signal 23 with the reference signal 24 and, after amplifying the detected error voltage, outputs the error voltage signal. This error voltage signal is inputted as the gain control signal 25 to the power amplifier circuit 11 through the gain control terminal 17 so as to control the gain of the power amplifier circuit 11.

It will be seen from the above description of the third embodiment of the present invention that the connection of the high-frequency amplifier 41 between the variable high-frequency attenuator 31 and the output monitor circuit 12 is advantageous in that the transmission circuit can also deal with the case where the monitor signal inputted from the output monitor circuit 12 to the variable high-frequency attenuator 31 is small.

Figure 6:
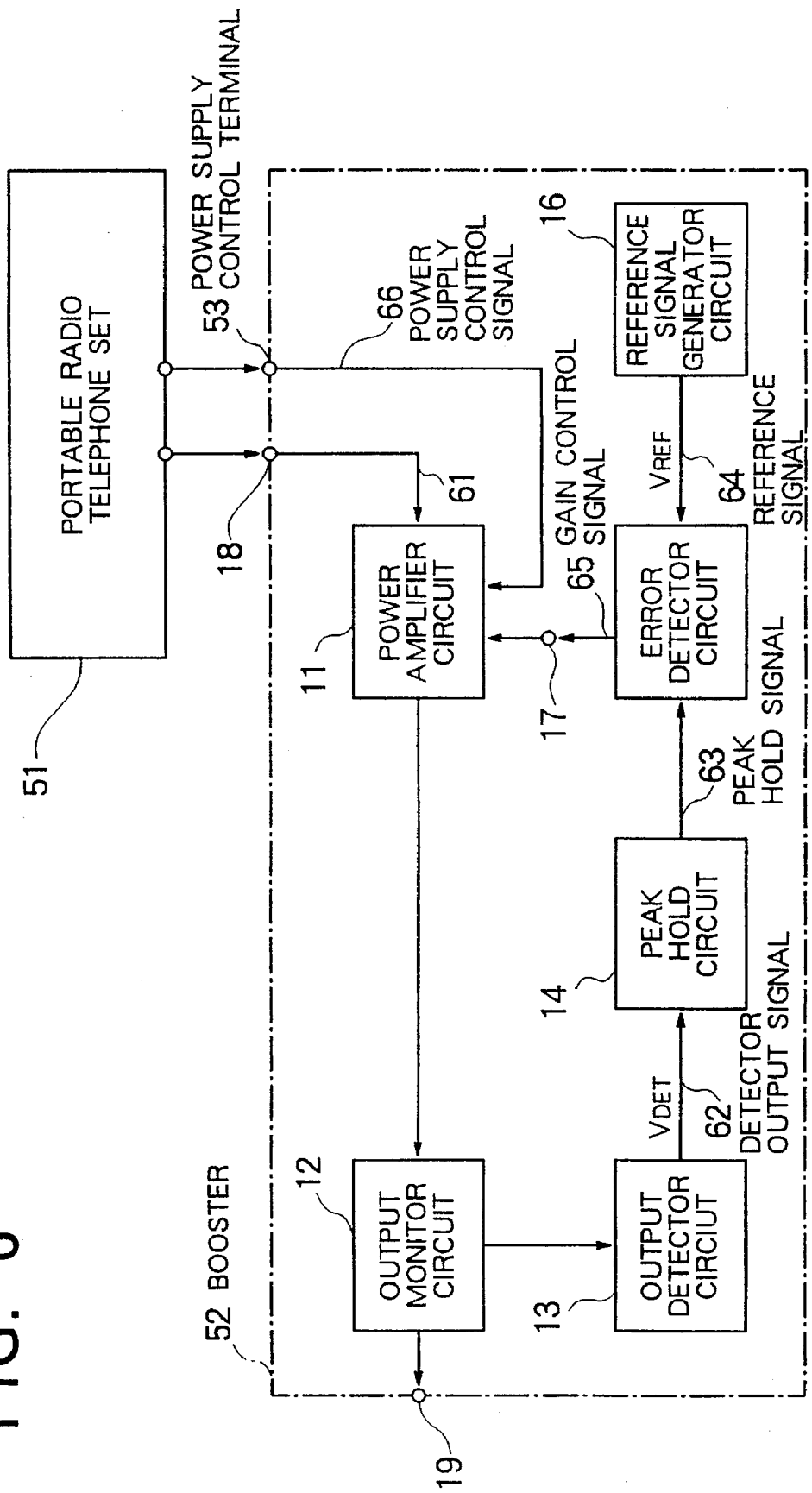
FIG. 6 is a block diagram showing the structure of a fourth embodiment of the transmission circuit according to the present invention.

FIG. 6 shows the structure of a fourth embodiment of the transmission circuit according to the present invention when the present invention is applied to a booster unit adapted to be connected to a portable radio telephone set operable as an independent device so as to amplify a high-frequency signal transmitted from the portable radio telephone set. FIGS. 7A to 7F show waveforms of various signals appearing in the transmission circuit. In FIG. 6, the reference numerals 51, 52 and 53 designate the portable radio telephone set, the booster unit, and a power supply control terminal connected to a power amplifier circuit 11 in the booster unit 52, respectively and, as for the remaining parts, the same reference numerals are used to designate the same or equivalent parts appearing in FIG. 2 so as to dispense with repetition of the same description.

Figure 7A:
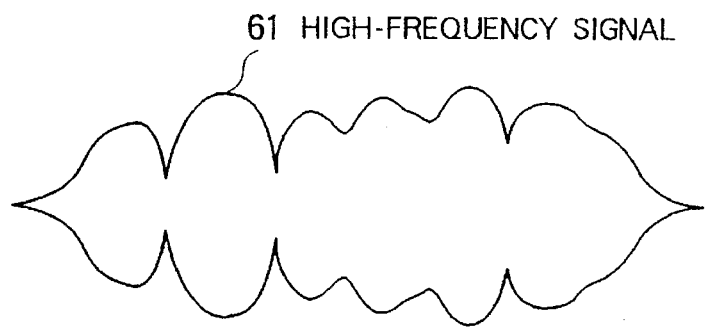
FIGS. 7A to 7F show waveforms of various signals appearing in the fourth embodiment of the transmission circuit according to the present invention.

The operation of the fourth embodiment of the transmission circuit of the present invention having the above structure will now be described by reference to FIG. 6 together with FIGS. 7A to 7F. A high-frequency signal 61 having a waveform as shown in FIG. 7A is inputted through the high-frequency signal input terminal 18 to be amplified by the power amplifier circuit 11 and is then passed through the output monitor circuit 12 to appear at the transmission output terminal 19 as the output signal of the transmission circuit.

Figure 7B:
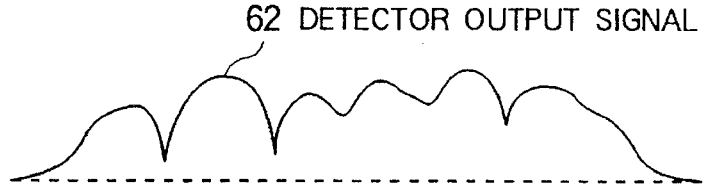
Figure 7C:
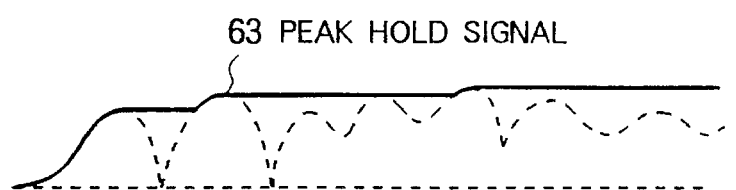
Figure 7D:
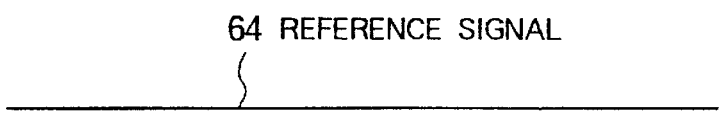
Figure 7E:
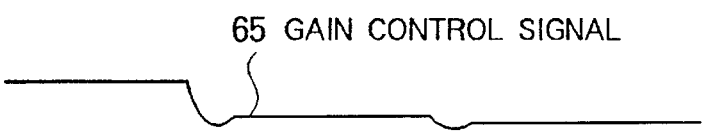
Figure 7F:
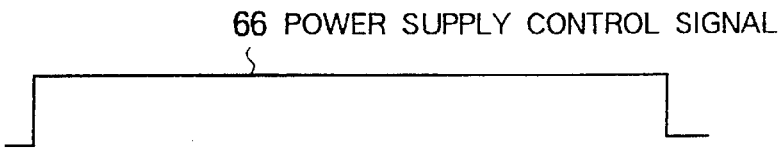

On the other hand, part of the output signal of the transmission circuit is branched by the output monitor circuit 12 and is inputted as the monitor signal to the output detector circuit 13 to be detected. A detector output signal 62 having a waveform as shown in FIG. 7B is inputted to the peak hold circuit 14 generating a peak hold signal 63 successively holding the peaks of the detector output signal 62 and having a waveform as shown in FIG. 7C. The peak hold circuit 14 is composed of the combination of, for example, time constant circuits, and its time constant during charging is selected to be small so as to follow the detector output signal 62, while its time constant during discharging is selected to be large so as to hold the peak value. The reference signal generator circuit 16 generates a reference signal 64 having a waveform as shown in FIG. 7D so as to set the reference level of the output signal of the transmission circuit. The error detector circuit 15 detects an error voltage by comparing the peak hold signal 63 with the reference signal 64 and outputs the detected error voltage as an error voltage signal. This error voltage signal is inputted as a gain control signal 65 having a waveform as shown in FIG. 7E to the power amplifier circuit 11 through the gain control terminal 17 so as to control the gain of the power amplifier circuit 11. At this time, a power supply control signal 66 having a waveform as shown in FIG. 7F and corresponding to a burst-like high-frequency signal is inputted from the portable radio telephone set 51 through the power supply control terminal 53 connected to the power amplifier circuit 11 so as to turn on/off the output signal of the transmission circuit thereby minimizing consumption of unnecessary power.

Thus, according to the fourth embodiment of the present invention, the power supply control terminal 53 is additionally connected to the power amplifier circuit 11, and the output signal of the transmission circuit is on/off controlled by the burst-like power supply control signal 66, so that consumption of unnecessary power can be minimized. In the case of this fourth embodiment too, an attenuator similar to the variable high-frequency attenuator 31 used in the second embodiment may be connected between the output monitor circuit 12 and the output detector circuit 13 or the high-frequency amplifier 41 used in the third embodiment may be connected to such an attenuator.

Figure 8:
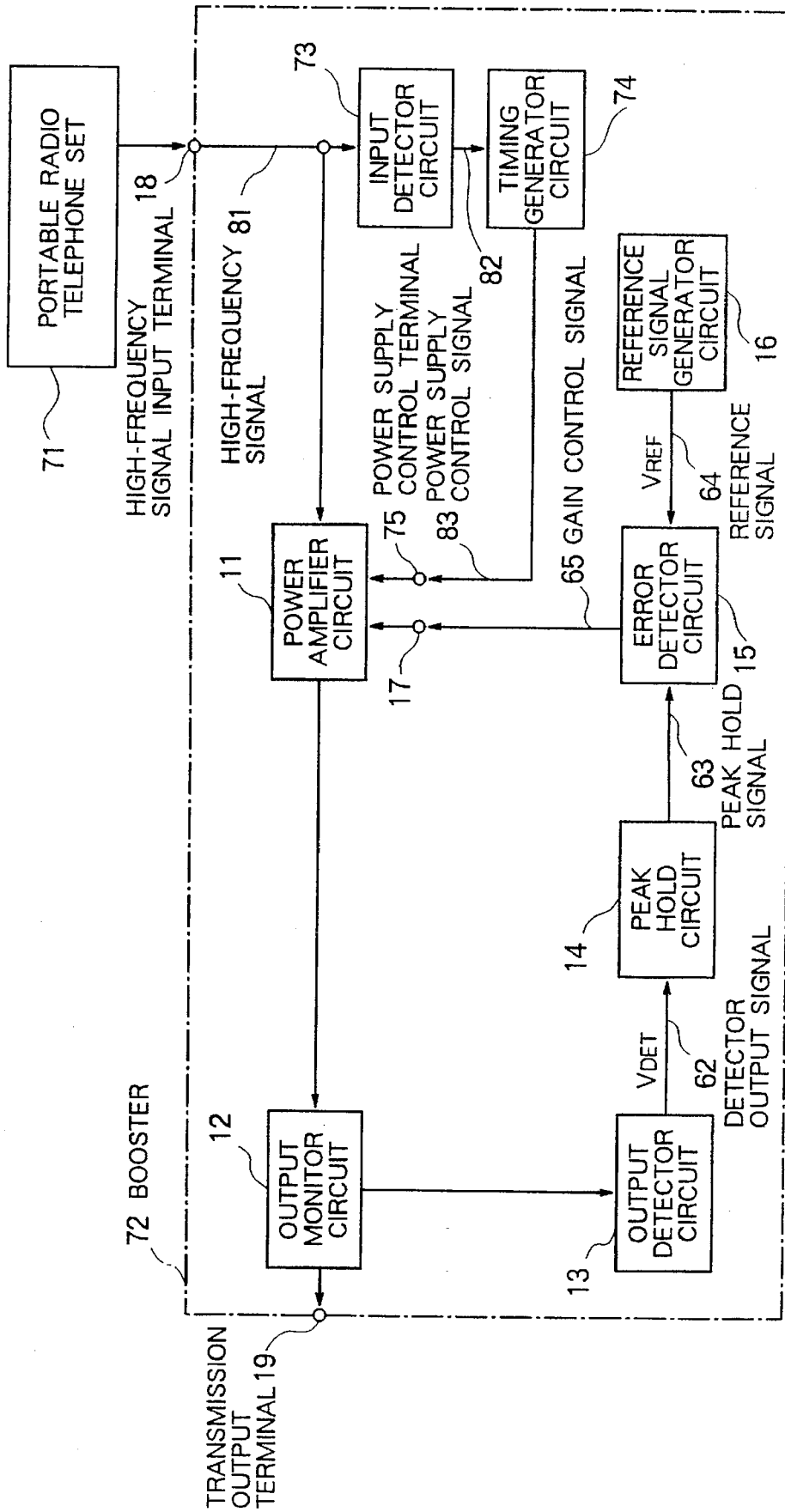
FIG. 8 is a block diagram showing the structure of a fifth embodiment of the transmission circuit according to the present invention.
Figure 9A:
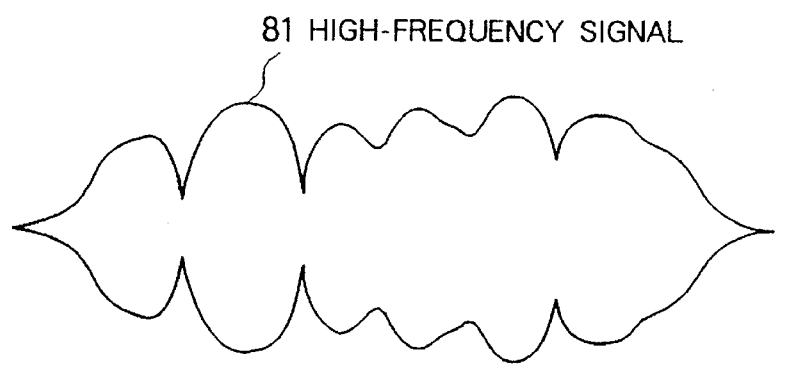
FIGS. 9A to 9C show waveforms of various signals appearing in the fifth embodiment of the transmission circuit according to the present invention.
Figure 9B:
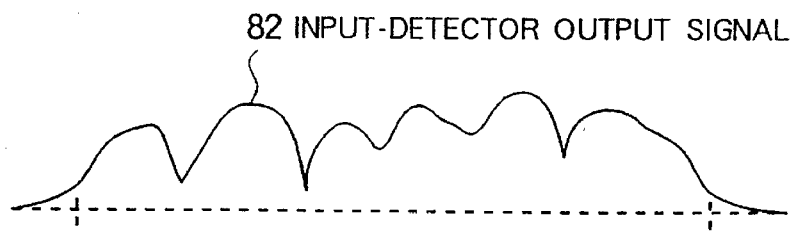
Figure 9C:
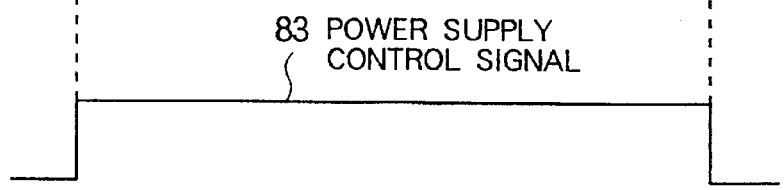

FIG. 8 is a block diagram showing the structure of a fifth embodiment of the transmission circuit according to the present invention when the present invention is applied to a booster unit adapted to be connected to a portable radio telephone set so as to amplify a high-frequency signal transmitted from the portable radio telephone set. FIGS. 9A to 9C show waveforms of various signals appearing in the transmission circuit, and FIGS. 7B to 7E are also applicable to this fifth embodiment of the present invention. In FIG. 8, the reference numerals 71, 72, 73, 74 and 75 designate the portable radio telephone set, the booster unit, an input detector circuit, a timing generator circuit, and a power supply control terminal for controlling the power amplifier circuit 11, respectively and, as for the remaining parts, the same reference numerals are used to designate the same or equivalent parts appearing in FIG. 2 so as to dispense with repetition of the same description.

The operation of the fifth embodiment of the transmission circuit of the present invention having the above structure will now be described by reference to FIG. 8 together with FIGS. 9A to 9C. A high-frequency signal 81 having a waveform as shown in FIG. 9A is inputted through the high-frequency signal input terminal 18 to be amplified by the power amplifier circuit 11 and then passed through the output monitor circuit 12 to appear at the transmission output terminal 19 as the output signal of the transmission circuit.

On the other hand, part of the output signal of the transmission circuit is branched by the output monitor circuit 12 to be inputted as the monitor signal to the output detector circuit 13 to be detected. The detector output signal 62, which is the output signal of the output detector circuit 13, is inputted to the peak hold circuit 14 generating the peak hold signal 63 successively holding the peaks of the detector output signal 62. The peak hold circuit 14 is composed of the combination of, for example, time constant circuits, and its time constant during charging is selected to be small so as to follow the detector output signal 62, while its time constant during discharging is selected to be large so as to hold the peak value. The reference signal generator circuit 16 generates the reference signal 64 which sets the reference level of the output signal of the transmission circuit. The error detector circuit 15 detects the error voltage by comparing the peak hold signal 63 with the reference signal 64 and, after amplifying the detected error voltage, outputs the error voltage signal. This error voltage signal is inputted as the gain control signal 65 to the power amplifier circuit 11 through the gain control terminal 17 so as to control the gain of the power amplifier circuit 11.

Part of the high-frequency signal 81 inputted through the high-frequency signal input terminal 18 and then branched is inputted to the input detector circuit 73 to be detected. An input-detector output signal 82 having a waveform as shown in FIG. 9B is inputted to the timing generator circuit 74 which generates a burst-like output signal turned on/off at certain rising and falling timing of the waveform of the input-detector output signal 82. This on/off signal is inputted as a power supply control signal 83 having a waveform as shown in FIG. 9C to the power amplifier circuit 11 through the power supply control terminal 75 so as to control the power supply of the power amplifier circuit 11.

Thus, according to the fifth embodiment of the present invention, the burst-like power supply control signal 83 inputted to the power amplifier circuit 11 through the power supply control terminal 75 is generated on the basis of the high-frequency signal 81, so that the signal line extending from the portable radio telephone set 71 is unnecessary, and the above manner of power supply control can minimize consumption of unnecessary power.

In this fifth embodiment too, an attenuator similar to the variable high-frequency attenuator 31 used in the second embodiment may be connected between the output monitor circuit 12 and the output detector circuit 13 or the high-frequency amplifier 41 used in the third embodiment may be connected to such an attenuator.

Figure 10:
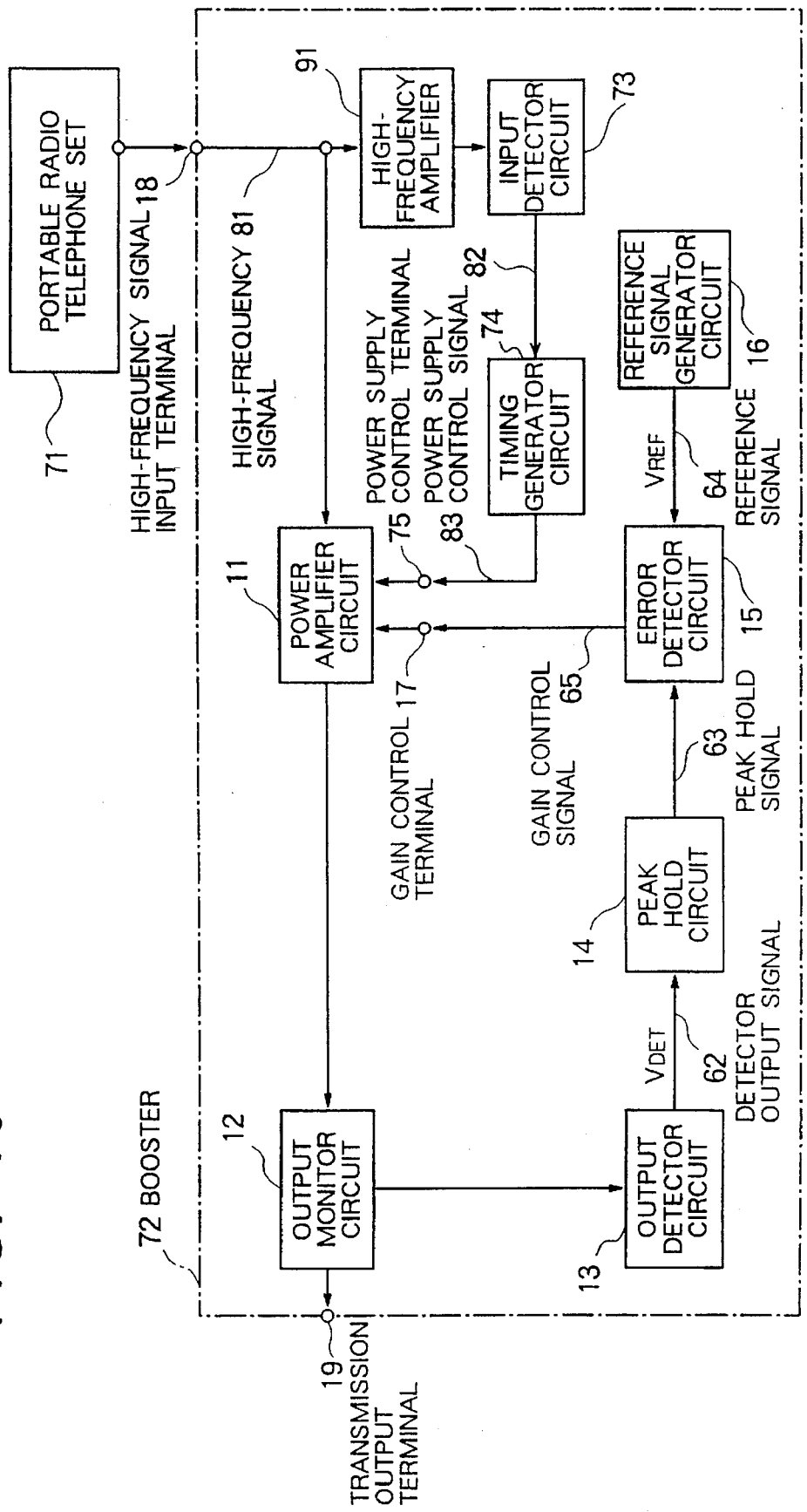
FIG. 10 is a block diagram showing the structure of a sixth embodiment of the transmission circuit according to the present invention.

FIG. 10 is a block diagram showing the structure of a sixth embodiment of the transmission circuit according to the present invention when the present invention is applied to a booster unit adapted for amplifying a high-frequency signal transmitted from the portable radio telephone set. In FIG. 10, the same reference numerals are used to designate the same or equivalent parts appearing in FIG. 8 so as to dispense with repetition of the same description. Waveforms of various signals appearing in the transmission circuit are the same as those shown in FIGS. 7A to 7F and FIGS. 9A to 9C. This sixth embodiment differs from the fifth embodiment in that a high-frequency amplifier 91 is connected between the high-frequency signal input terminal 18 and the input detector circuit 73.

The operation of the sixth embodiment of the transmission circuit of the present invention having the above structure will now be described by reference to FIG. 10 together with FIGS. 7A to 7F and FIGS. 9A to 9C. A high-frequency signal 81 inputted through the high-frequency signal input terminal 18 is amplified by the power amplifier circuit 11 and then passed through the output monitor circuit 12 to appear at the transmission output terminal 19 as the output signal of the transmission circuit.

On the other hand, part of the output signal of the transmission circuit is branched by the output monitor circuit 12 and is inputted as the monitor signal to the output detector circuit 13 to be detected. The detector output signal 62 is inputted to the peak hold circuit 14 to appear as the peak hold signal 63 successively holding the peaks of the detector output signal 62. The peak hold circuit 14 is composed of the combination of, for example, time constant circuits, and its time constant during charging is selected to be small so as to follow the detector output signal 62, while its time constant during discharging is selected to be large so as to hold the peak value. The reference signal generator circuit 16 generates the reference signal 64 which sets the reference level of the output signal of the transmission circuit. The error detector circuit 15 detects the error voltage by comparing the peak hold signal 63 with the reference signal 64 and, after amplifying the detected error voltage, outputs the error voltage signal. This error voltage signal is inputted as the gain control signal 65 to the power amplifier circuit 11 through the gain control terminal 17 connected to the power amplifier circuit 11 so as to control the gain of the power amplifier circuit 11.

Part of the high-frequency signal 81 inputted from the portable radio telephone set 71 through the high-frequency signal input terminal 18 and then branched is inputted, after being amplified by the high-frequency amplifier 91, to the input detector circuit 73 to be detected. The input-detector output signal 82 is inputted to the timing generator circuit 74 which generates the burst-like power supply control signal 83 turned on/off at certain rising and falling timing of the waveform of the input-detector output signal 82. This power supply control signal 83 is inputted to the power amplifier circuit 11 through the power supply control terminal 75 so as to control the power supply of the power amplifier circuit 11.

Thus, according to the sixth embodiment of the present invention, the connection of the high-frequency amplifier 91 between the high-frequency signal input terminal 18 and the input detector circuit 73 is advantageous in that the transmission circuit can also deal with the case where the high-frequency signal 81 is small and, because the low level at the leading edge of the burst signal can be detected, the leading edge of the burst signal can be detected earlier than heretofore so that the desired on/off control of the output signal of the transmission circuit can be reliably attained.

In this sixth embodiment too, an attenuator similar to the variable high-frequency attenuator 31 used in the second embodiment may be connected between the output monitor circuit 12 and the output detector circuit 13 or the variable high-frequency amplifier 41 used in the third embodiment may be connected to such an attenuator.

Figure 11:
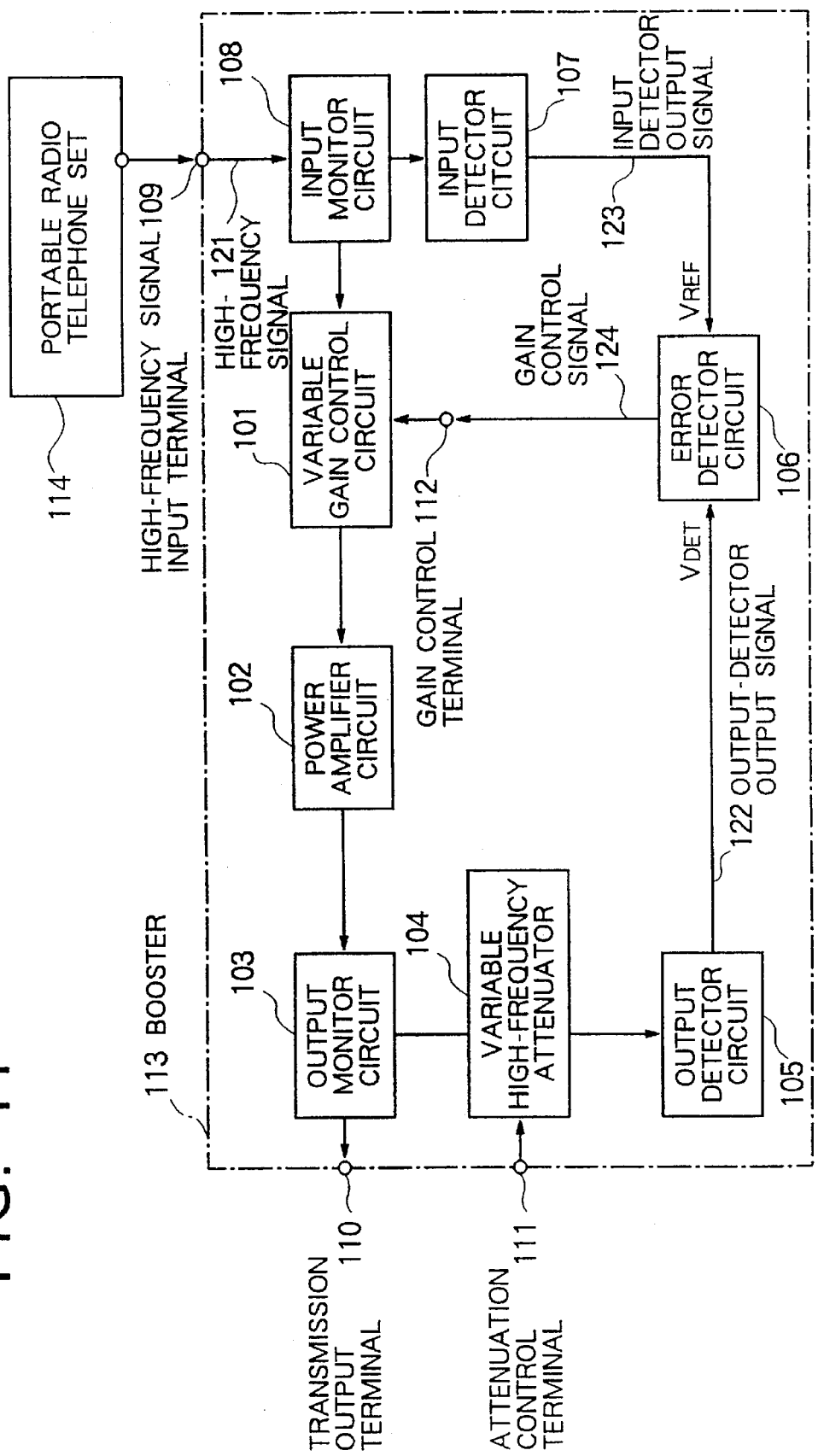
FIG. 11 is a block diagram showing the structure of a seventh embodiment of the transmission circuit according to the present invention.

A seventh embodiment of the present invention will now be described by reference to the drawings. FIG. 11 is a block diagram showing the structure of the seventh embodiment of the transmission circuit according to the present invention, and FIGS. 12A to 12D show waveforms of various signals appearing in the transmission circuit.

Referring to FIG. 11 showing application of the seventh embodiment of the transmission circuit of the present invention to a booster unit 113 adapted to be connected to a portable radio telephone set 114, the transmission circuit comprises a variable gain control circuit 101, a power amplifier circuit 102, an output monitor circuit 103, a variable high-frequency attenuator 104, an output detector circuit 105, an error detector circuit 106, an input detector circuit 107, an input monitor circuit 108, a high-frequency signal input terminal 109, a transmission output terminal 110, an attenuation control terminal 111 connected to the variable high-frequency attenuator 104, and a gain control terminal 112 of the variable gain control circuit 101.

The operation of the seventh embodiment of the transmission circuit of the present invention having the above structure will now be described by reference to FIG. 11 together with FIGS. 12A to 12D. A high-frequency signal 121 having a waveform as shown in FIG. 12A is inputted from the portable radio telephone set 114 through the high-frequency signal input terminal 109 and is branched by the input monitor circuit 108. The branched part of the high-frequency signal 121 is, after being amplified by the combination of the variable gain control circuit 101 and the power amplifier circuit 102, branched again by the output monitor circuit 103 to appear at the transmission output terminal 110 as the output signal of the transmission circuit.

On the other hand, part of the output signal of the transmission circuit is branched by the output monitor circuit 103 to be inputted as a monitor signal to the variable high-frequency attenuator 104, and, after being attenuated by a predetermined amount by a control signal inputted through the attenuation control terminal 111, inputted to and detected by the output detector circuit 105 to appear as an output-detector output signal 122 having a waveform as shown in FIG. 12B.

Also, part of the input signal 121 branched by the input monitor circuit 108 is inputted to and detected by the input detector circuit 107 to appear as an input-detector output signal 123 having a waveform as shown in FIG. 12C. The error detector circuit 106 detects an error voltage by comparing the output signal 122 of the output detector circuit 105 with the output signal 123 of the input detector circuit 107 using the latter output signal 123 as a reference signal, and, after amplifying the error voltage, outputs an error voltage signal. This error voltage signal is inputted as a gain control signal 124 having a waveform as shown in FIG. 12D to the variable gain control circuit 101 through the gain control terminal 112 so as control the gain or attenuation.

Thus, the seventh embodiment of the present invention is advantageous in that, even when a modulated wave signal having a varying amplitude is inputted to the transmission circuit, the input signal is detected to provide a reference signal including varying amplitude components, and such a reference signal is used for error detection, so that the desired satisfactory transmission performance can be exhibited without the occurrence of undesirable distortion of the output waveform attributable to the loop control.

Figure 13:
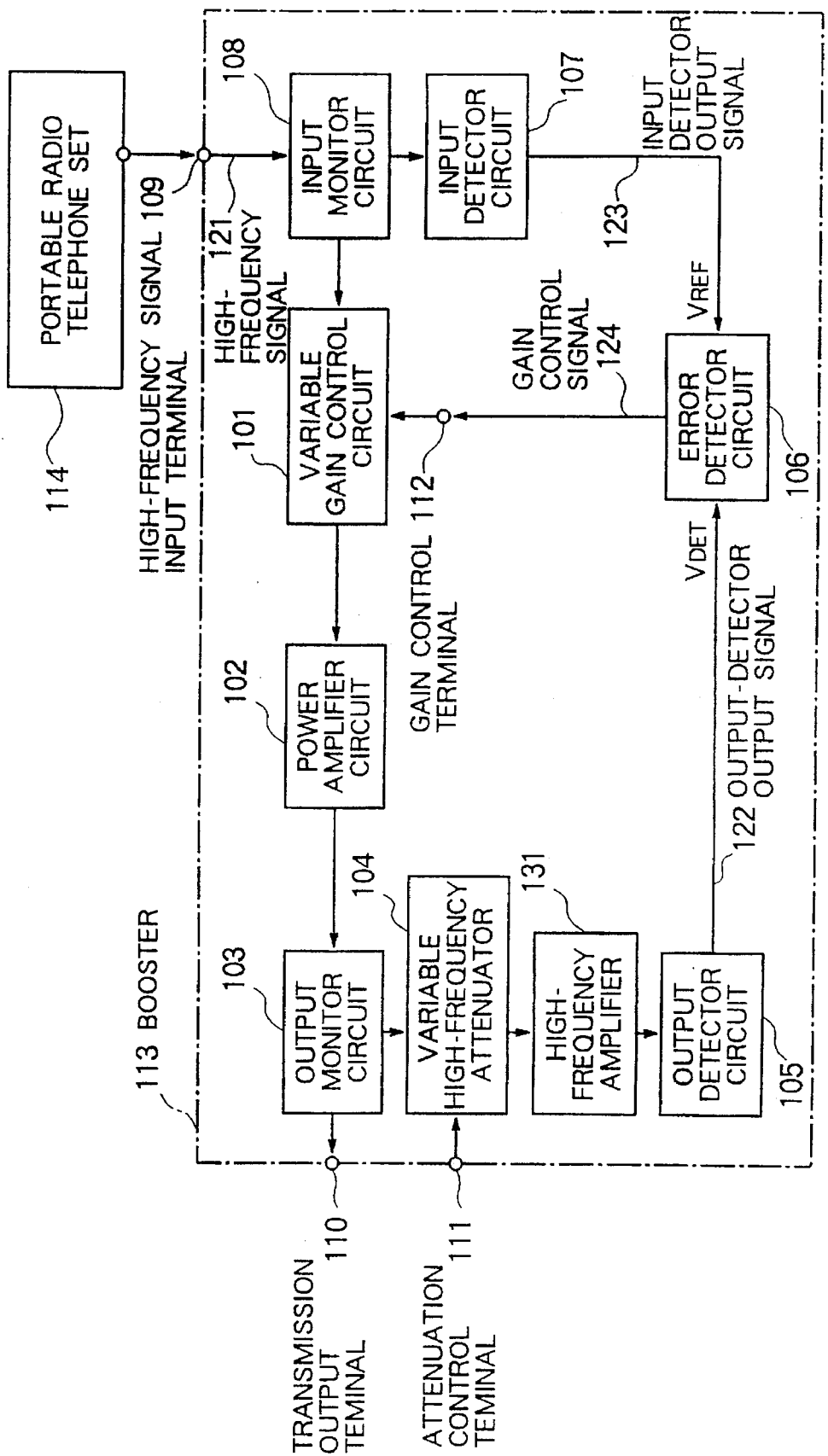
FIG. 13 is a block diagram showing the structure of an eighth embodiment of the transmission circuit according to the present invention.

FIG. 13 is a block diagram showing the structure of an eighth embodiment of the transmission circuit according to the present invention. In FIG. 13, the same reference numerals are used to designate the same or equivalent parts appearing in FIG. 11 so as to dispense with repetition of the same description. Waveforms of various signals appearing in the transmission circuit are the same as those shown in FIGS. 12A to 12D. This eighth embodiment is a partial modification of the seventh embodiment and differs from the seventh embodiment in that a high-frequency amplifier 131 is connected between the variable high-frequency attenuator 104 and the output detector circuit 105.

The operation of the eighth embodiment of the transmission circuit of the present invention having the above structure will now be described by reference to FIG. 13 together with FIGS. 12A to 12D.

The high-frequency signal 121 inputted from the portable radio telephone set 114 through the high-frequency signal input terminal 109 and then passed through the input monitor circuit 108 is, after being amplified by the combination of the variable gain control circuit 101 and the power amplifier circuit 102, passed through the output monitor circuit 103 to appear at the transmission output terminal 110 as the output signal of the transmission circuit.

On the other hand, part of the output signal of the transmission circuit is branched by the output monitor circuit 103 to be inputted as the monitor signal to the variable high-frequency attenuator 104 and, after being attenuated by a predetermined amount by the control signal inputted through the attenuation control terminal 111 and amplified by the high-frequency amplifier 131, inputted to and detected by the output detector circuit 105 to appear as the output-detector output signal 122 which is the output signal of the output detector circuit 105. Also, part of the input signal 121 branched by the input monitor circuit 108 is inputted to and detected by the input detector circuit 107 to appear as the input-detector output signal 123 which is the output signal of the input detector circuit 107. The error detector circuit 106 detects the error voltage by comparing the output-detector output signal 122 with the input-detector output signal 123 using the latter output signal 123 as the reference signal and, after amplifying the error voltage, outputs the error voltage signal. This error voltage signal is inputted as the gain control signal 124 to the variable gain control circuit 101 so as to control the gain or attenuation.

Thus, the eighth embodiment of the present invention in which the high-frequency amplifier 131 is connected between the variable high-frequency attenuator 104 and the output detector circuit 105 is advantageous in that the transmission circuit can also deal with the case where the monitor signal outputted from the output monitor circuit 103 is small.

Figure 14:
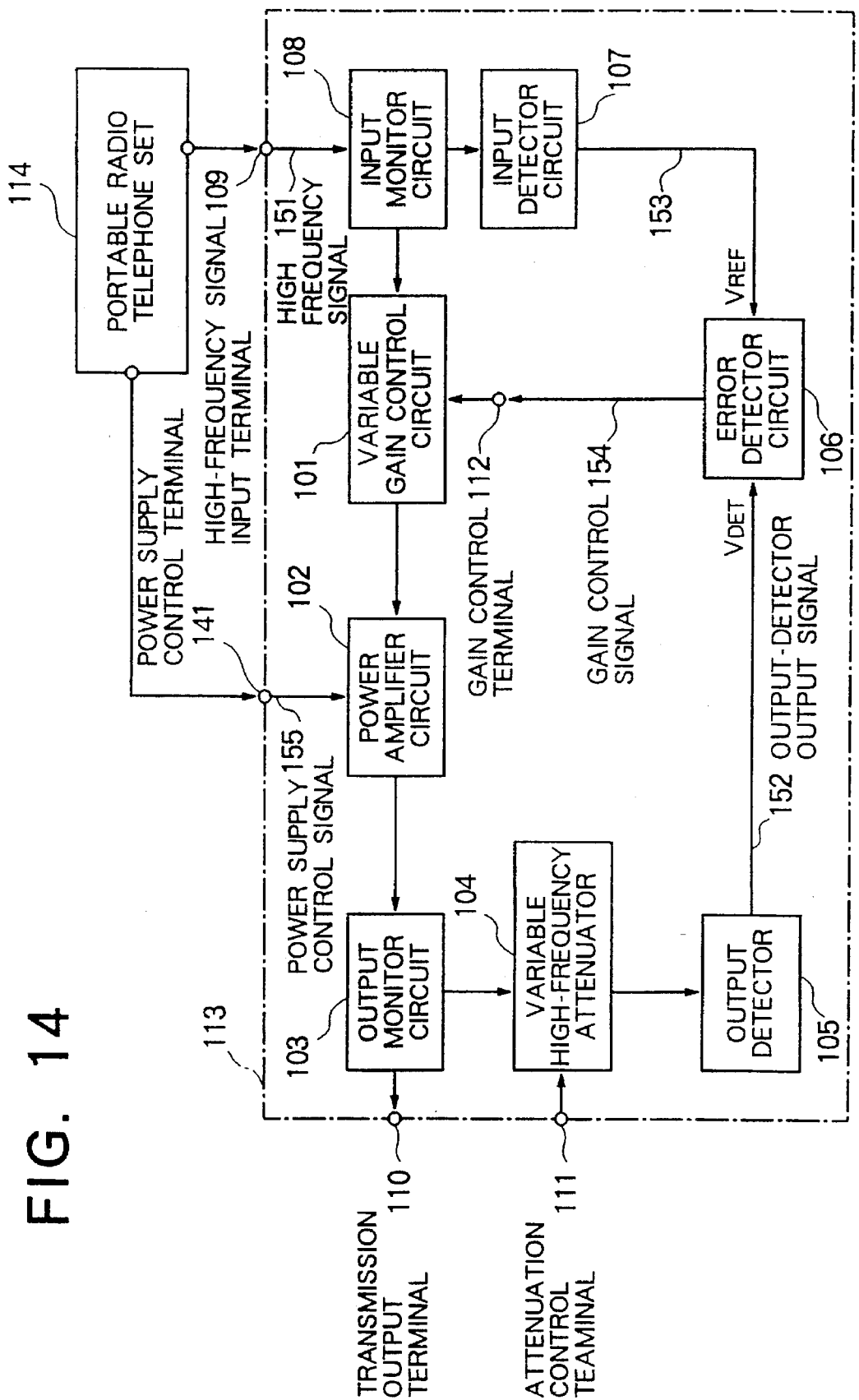
FIG. 14 is a block diagram showing the structure of a ninth embodiment of the transmission circuit according to the present invention.

FIG. 14 is a block diagram showing the structure of a ninth embodiment of the transmission circuit according to the present invention, and FIGS. 15A to 15E show waveforms of various signals appearing in the transmission circuit. The ninth embodiment is a partial modification of the seventh embodiment shown in FIG. 11, and the same reference numerals are used to designate the same or equivalent parts appearing in FIG. 11 so as to dispense with repetition of the same description. This ninth embodiment differs from the seventh embodiment in that a power supply control terminal 141 is additionally connected to the power amplifier circuit 102.

Figure 15A:
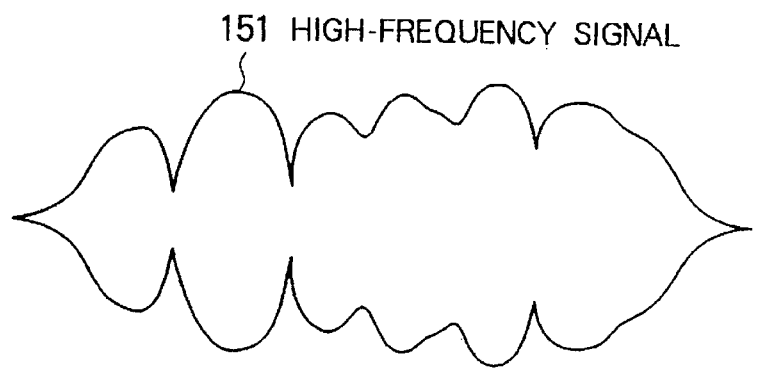
FIGS. 15A to 15E show waveforms of various signals appearing in the ninth embodiment of the transmission circuit according to the present invention.

The operation of the ninth embodiment of the transmission circuit of the present invention having the above structure will now be described by reference to FIG. 14 together with FIGS. 15A to 15E. A high-frequency signal 151 having a waveform as shown in FIG. 15A is inputted from the portable radio telephone set 114 through the high-frequency signal input terminal 109 and then passed through the input monitor circuit 108. The output signal of the input monitor circuit 108 is amplified by the combination of the variable grain control circuit 101 and the power amplifier circuit 102 and then passed through the output monitor circuit 103, appear at the transmission output terminal 110 as the output signal of the transmission circuit.

Figure 15B:
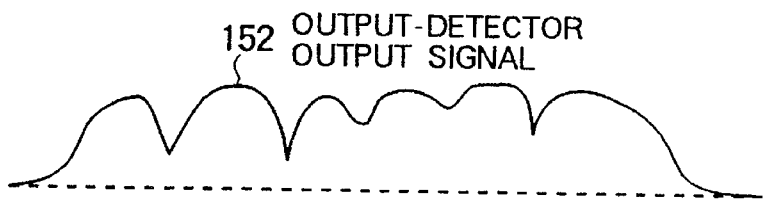
Figure 15C:
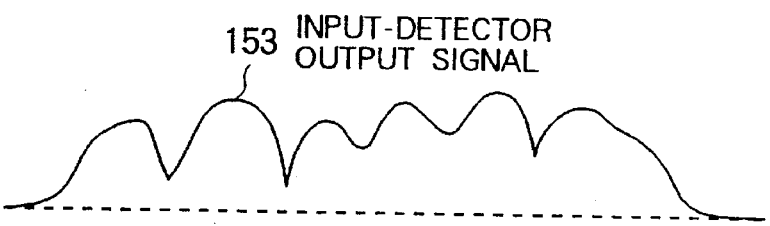
Figure 15D:
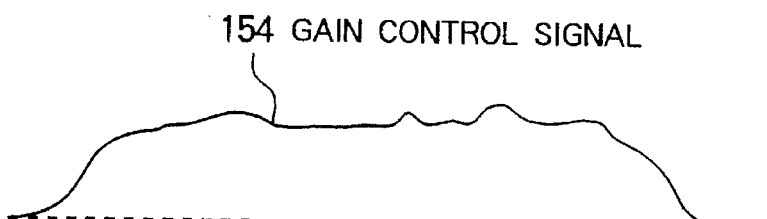
Figure 15E:
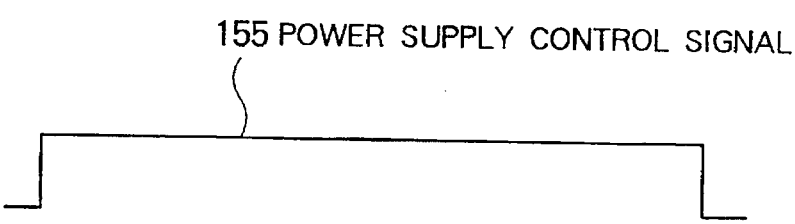

On the other hand, part of the output signal of the transmission circuit is branched by the output monitor circuit 103 to be inputted as the monitor signal to the variable high-frequency attenuator 104 and, after being attenuated by a predetermined amount by the control signal inputted through the attenuation control terminal 111, inputted to and detected by the output detector circuit 105 to appear as an output-detector output signal 152 having a waveform as shown in FIG. 15B. Also, part of the input signal 151 branched by the input monitor circuit 108 is inputted to and detected by the input detector circuit 107 to appear as an input-detector output signal 153 having a waveform as shown in FIG. 15C. The error detector circuit 106 detects the error voltage by comparing the output-detector output signal 152 with the input-detector output signal 153 using the latter output signal 153 as the reference signal and, after amplifying the detected error voltage, outputs the error voltage signal. This error voltage signal is inputted as a gain control signal 154 having a waveform as shown in FIG. 15D to the variable gain control circuit 101 through the gain control terminal 112 so as to control the gain or attenuation. At this time, a power supply control signal 155 having a waveform as shown in FIG. 15E and corresponding to a burst-like high-frequency signal inputted from the portable radio telephone set 114 is inputted through the power supply control terminal 141, so that the output signal of the transmission circuit is on/off controlled to minimize consumption of unnecessary power.

Thus, the ninth embodiment of the present invention, in which the power supply control terminal 141 is additionally connected to the power amplifier circuit 102, is advantageous in that the output signal of the transmission circuit is on/off controlled by the burst-like power supply control signal 155 so that consumption of unnecessary power can be minimized. In this ninth embodiment too, the high frequency amplifier 131 may be connected between the variable high-frequency attenuator 104 and the output detector circuit 105 as in the case of the eighth embodiment.

FIG. 16 is a block diagram showing the structure of a tenth embodiment of the transmission circuit according to the present invention, and FIGS. 17A to 17E show waveforms of various signals appearing in the transmission circuit. This tenth embodiment is a partial modification of the seventh embodiment shown in FIG. 11, and the same reference numerals are used to designate the same or equivalent parts appearing in FIG. 11 so as to dispense with repetition of the same description. This tenth embodiment differs from the seventh embodiment in that a power supply control terminal 161 is additionally connected to the power amplifier circuit 102, and a timing generator circuit 162 receiving the output signal of the input detector circuit 107 as its input signal is additionally provided.

Figure 17A:
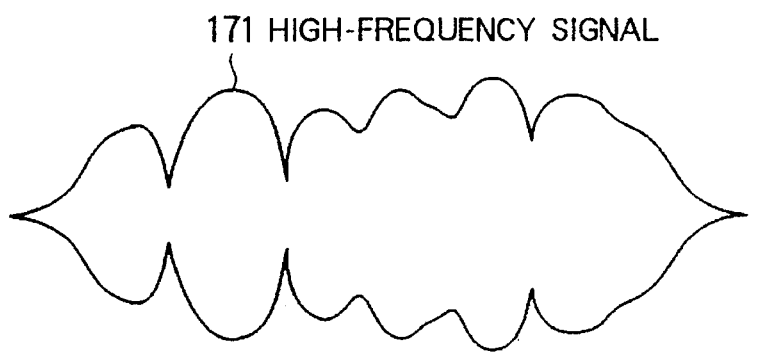
FIGS. 17A to 17E show waveforms of various signals appearing in the tenth embodiment of the transmission circuit according to the present invention.

The operation of the tenth embodiment of the transmission circuit of the present invention having the above structure will now be described by reference to FIG. 16 together with FIGS. 17A to 17E. A high-frequency signal 171 having a waveform as shown in FIG. 17A is inputted from the portable radio telephone set 114 through the high-frequency input terminal 109 and then passed through the input monitor circuit 108. The output signal of the input monitor circuit 108 is, after amplified by the combination of the variable gain control circuit 101 and the power amplifier circuit 102 and then passed through the output monitor circuit 103, to appear at the transmission output terminal 110 as the output signal of the transmission circuit.

Figure 17B:
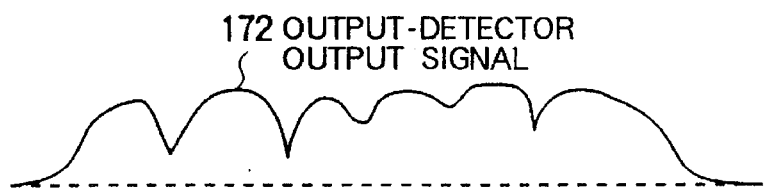
Figure 17C:
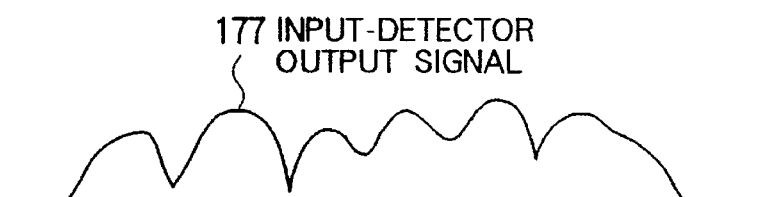

On the other hand, part of the output signal of the transmission circuit is branched by the output monitor circuit 103 to be inputted as the monitor signal to the variable high-frequency attenuator 104 and, after being attenuated by a predetermined amount by the control signal inputted through the attenuation control terminal 111, inputted to and detected by the output detector circuit 105 to appear as an output-detector output signal 172 having a waveform as shown in FIG. 17B. Also, part of the input signal 171 branched by the input monitor circuit 108 is inputted to and detected by the input detector circuit 107 to appear as an input-detector output signal 173 having a waveform as shown in FIG. 17C. The error detector circuit 106 detects the error voltage by comparing the output-detector output signal 172 with the input-output signal 173 using the latter output signal 173 as a reference signal and outputs the error voltage signal. This error voltage signal is inputted as a gain control signal 175 having a waveform as shown in FIG. 17E to the variable gain control circuit 101 through the gain control terminal 112 so as to control the gain or attenuation.

Figure 17D:
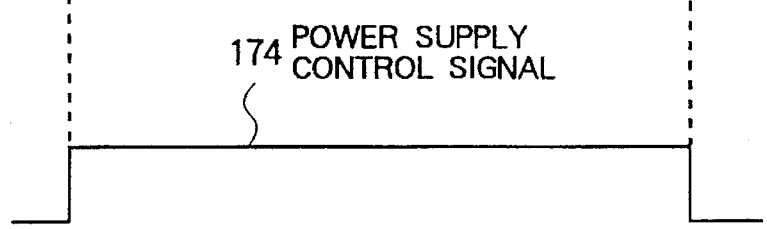
Figure 17E:
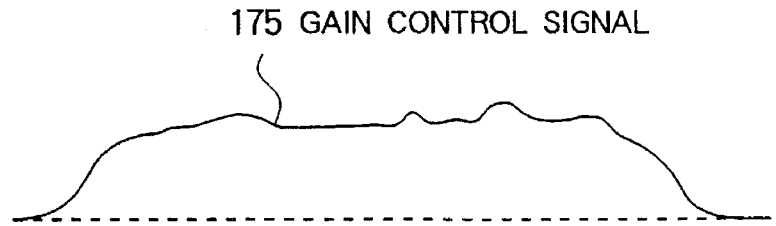

The input-detector output signal 173 outputted from the input detector circuit 107 is inputted to the timing generator circuit 162 to appear as a power supply control signal 174 having a waveform as shown in FIG. 17D and turned on/off at certain rising and falling timing of the waveform of the burst-like high-frequency signal 171 inputted from the portable radio telephone set 114. This burst-like power supply control signal 174 is inputted through the power supply control terminal 161 to the power amplifier circuit 102 so as to control the power supply of the power amplifier circuit 102.

Thus, according to the tenth embodiment of the present invention, the burst-like power control signal 174 inputted to the power amplifier circuit 102 through the power supply control terminal 161 is generated on the basis of the high-frequency signal 171, so that a signal line extending from the portable radio telephone set 114 is unnecessary, and the above manner of power supply control can minimize consumption of unnecessary power. In this tenth embodiment too, the high-frequency amplifier 131 used in the eighth embodiment may be connected between the variable high-frequency attenuator 104 and the output detector circuit 105.

We claim:

1. A transmission circuit comprising:

power amplifier means for amplifying a high-frequency signal inputted through a high-frequency signal input terminal;

output monitor means for outputting an output signal of said power amplifier means as an output signal of said transmission circuit and for outputting part of the output signal of said transmission circuit as a monitor signal;

output detector means for receiving said monitor signal of said output monitor means as its input signal and for subjecting the high-frequency signal to envelope detection thereby generating an output signal representing a result of the envelope detection;

peak hold means for receiving said output signal of said output detector means as its input signal and for successively holding peaks of the output signal of said output detector means;

reference signal generator means for generating a voltage signal for setting a reference level of the output signal of said transmission circuit; and error detector means for comparing an output signal of said peak hold means with an output signal of said reference signal generator means to detect an error voltage, an output signal of said error detector means being used to control a gain of said power amplifier means.

2. A transmission circuit according to claim 1, wherein variable high-frequency attenuator means is connected between said output monitor means and said output detector means.

3. A transmission circuit according to claim 2, wherein high-frequency amplifier means is connected between said variable high-frequency attenuator means and said output detector means.

4. A transmission circuit according to claim 1, wherein said transmission circuit is used in a booster unit connected to a portable radio telephone set operable as an independent device for amplifying a high-frequency signal transmitted from said portable radio telephone set, said transmission circuit including a power supply control terminal additionally connected to said power amplifier means, so that a power supply voltage supplied to said power amplifier means can be switched over in response to a transmission on/off signal corresponding to a transmission burst signal transmitted from said portable radio telephone set.

5. A transmission circuit according to claim 1, wherein said transmission circuit is used in a booster unit connected to a portable radio telephone set operable as an independent device for amplifying a high-frequency signal transmitted from said portable radio telephone set, said transmission circuit including input detector means for receiving a branched part of a transmission burst signal transmitted from said portable radio telephone set through said high-frequency signal input terminal as its input signal and for subjecting the high-frequency signal to envelope detection to generate an output signal representing a result of the envelope detection, and timing generator means for receiving an output signal of said input detector means as its input signal and for generating a timing signal corresponding to the output signal of said input detector means, an output signal of said timing generator means being used for switching a power supply voltage supplied to said power amplifier means.

6. A transmission circuit according to claim 5, wherein high-frequency amplifier means is connected between said high-frequency signal input terminal and said input detector means.

7. A transmission circuit for use in a booster unit connected to a portable radio telephone set operable as an independent device for amplifying a high-frequency signal transmitted from said portable radio telephone set, said transmission circuit comprising:

input monitor means for receiving the high-frequency signal transmitted from said portable radio telephone set as its input signal and for outputting part of the high-frequency signal as a monitor signal;

variable gain control means for receiving an output signal of said input monitor means as is input signal, said variable gain control means being responsive to a gain control signal so as to make variable a gain or attenuation;

power amplifier means for receiving an output signal of said variable gain control means as its input signal to amplify the high-frequency signal;

output monitor means for generating an output signal of said power amplifier means as an output signal of said transmission circuit and for outputting part of the output signal of said power amplifier means as a monitor signal;

variable high-frequency attenuator means for receiving said monitor signal of said output monitor means as its input signal to attenuate the high-frequency signal and for making variable an amount of attenuation in response to an external control signal;

output detector means for receiving an output signal of said variable high-frequency attenuator means as its input signal and for subjecting the high-frequency signal to envelope detection to generate an output signal representing a result of the envelope detection;

input detector means, having at least one output terminal, for receiving the monitor signal outputted from said input monitor means as its input signal and for subjecting the high-frequency signal to envelope detection to generate an output signal representing the result of the envelope detection; and error detector means for comparing an output signal of said output detector means with an output signal of said input detector means to detect an error voltage, an output signal of said error detector means being supplied to said variable gain control means as said gain control signal.

8. A transmission circuit according to claim 7, wherein high-frequency amplifier means is connected between said variable high-frequency attenuator means and said output detector means.

9. A transmission circuit according to claim 7, wherein a power supply control terminal is additionally connected to said power amplifier means so that the power supply voltage supplied to said power amplifier means can be switched over by a transmission on/off signal corresponding to a transmission burst signal transmitted from said portable radio telephone set.

10. A transmission circuit according to claim 7, further comprising timing generator means, connected between said input detector means and said power amplifier means, for ascertaining a timing corresponding to the envelope detection of said input detector means and for generating in response a signal which is used for switching the power supply voltage supplied to said power amplifier means.

11. A transmission circuit comprising:

output detector means for subjecting part of an output signal of said transmission circuit to envelope detection thereby generating an output signal representing a result of the envelope detection;

peak hold means for receiving an output signal of said output detector means as its input signal and for successively holding peaks of the output signal of said output detector means; and error detector means for comparing an output signal of said peak hold means with a reference signal to detect an error voltage, an output signal of said error detector means being used to control a gain of power amplifier means.

* * * * *